United States Patent [19]

Kai

[11] 4,389,278
[45] Jun. 21, 1983

[54] METHOD FOR MANUFACTURING CIRCUIT BOARD WITH THROUGH HOLE

[76] Inventor: Kazuo Kai, 3-28-1, Kuwazu, Higashi Sumiyoshi-ku, Osaka, Japan

[21] Appl. No.: 394,620

[22] Filed: Jul. 2, 1982

[30] Foreign Application Priority Data

Jul. 25, 1981 [JP] Japan ................................ 56/116566

[51] Int. Cl.³ .......................... C25D 5/02; B05D 5/12; C23F 1/02; B44C 1/22
[52] U.S. Cl. ..................................... 156/630; 29/852; 156/151; 156/634; 156/661.1; 156/902; 204/15; 427/97; 430/315
[58] Field of Search ...................... 204/15, 20, 22, 24; 156/630, 634, 644, 656, 659.1, 661.1, 902, 150, 151; 427/96-98; 29/852; 174/68.5; 430/312, 313, 315, 318

[56] References Cited

U.S. PATENT DOCUMENTS

| | | | |
|---|---|---|---|
| 3,457,638 | 7/1969 | Johnson | 427/97 X |
| 3,799,802 | 3/1974 | Schneble et al. | 427/97 X |
| 4,135,988 | 1/1979 | Dugan et al. | 204/15 |
| 4,211,603 | 7/1980 | Reed | 156/659.1 |

*Primary Examiner*—William A. Powell
*Attorney, Agent, or Firm*—Koda and Androlia

[57] ABSTRACT

A method for manufacturing a circuit board with through hole, by taking the processing steps of: forming a preferred wire distribution pattern by selectively etching the two-side copper-clad laminate; piercing holes to be used as the through holes at the specified locations; masking the surface of the board except the through hole portion by using the conductive ink and the pH-resistant ink; forming the conductive film over the through hole by the electroless plating; forming the metal foil with appropriate thickness over the conductive film by the electroplating, by using the conductive ink layer as the electrode at one end; and finally, removing the conductive ink and the pH-resistant ink.

5 Claims, 2 Drawing Figures

METHOD FOR MANUFACTURING CIRCUIT BOARD WITH THROUGH HOLE

BACKGROUND OF THE INVENTION

1. Field of the Invention

The present invention relates to a method for manufacturing a circuit board, and particularly to a method for manufacturing a circuit board provided with a so called through hole.

2. Prior Art

Circuit boards used for electronic apparatus nowadays are frequently provied with through hole in compliance with the demand for high density assembly of electronic parts. In response to such trend, various methods for manufacturing circuit boards, with purpose of improving the reliability in continuity of through hole have been proposed. Of those methods provided, from the viewpoint of the reliability of the through hole, so called the CC-4 method is considered to be highly recommendable as manufacturing method. However, this method cannot necessarily be regarded preferable in terms of mass production, because of its defect that it takes as long as 20–30 hours for forming the metal layer of about 35$\mu$ thick.

Therefore, even now, many circuit boards having the through holes are manufactured by the methods as continuation of the conventionally used processes which are called the etched foil process or the subtractive process.

FIG. 1, (A) and (B) respectively show the processes manufacturing the circuit boards with through holes, by using such methods as mentioned above. In FIG. 1, (A) shows an example of manufacturing processes by using a copper-clad laminate, while (B) in the same Figure shows an example wherein copper is precipitated and grown on plastic board for manufacturing.

In (A) of FIG. 1, (b) shows the state wherein a pierced hole 3 is formed to be used as the through hole, at a desired position in a copper-clad laminate (a) with the specified dimensions. Designated at 1 is a board made of epoxy material or phenol material, and 2 is about 35$\mu$ thick copper foil adhered in advance onto the above-mentioned board 1. After providing the through hole 3, its surface is pretreated for surface activation, by means of chemical blocking and palladium solution, etc. Thereafter, the electroless plating of copper is performed ((c) of FIG. 1 (A)). Then, by using the electroplating, about 35$\mu$ thick plating copper 5 is precipitated and grown over the copper foil 2 as well as over the copper plate film 4 that is formed by the electroless plating over the surface of the through hole 3 ((d) of FIG. 1 (A)). Furthermore, the wiring section is masked with the plating resist film 6 obtained by a technique of the screen printing of the epoxy system ink ((e) of FIG. 1 (A)). Finally, through removing the unmasked portion with etching solution, then by removing the foregoing plating resist film 6, the circuit board having the through hole with desired wiring pattern can be obtained.

In the method shown in (B) of FIG. 1, the pierced hole 3 to be used as through hole is formed in the board with a specified size in the processing stages of (a) and (b), then, the copper plate film 4 is formed over the entire surface of the board, including the surface of the through hole 3, by the electroless plating, in the process (c). Thereafter, by taking the respective processing steps of the formation of the plating resist film 6 ((d) of FIG. 1 (B)), the formation of the plated copper for the wiring section by electroplating ((a) of FIG. 1 (B)), and the etching ((f) of FIG. 1 (B)), the circuit board having the through holes with the desired wiring pattern is obtained.

However, such manufacturing methods generally have the following disadvantages.

First, in the manufacturing method shown in (B) of FIG. 1, all copper foils necessary for the wiring are obtained by plating, and in such plating, the sufficient chemical as well as physical adhesion cannot be expected to occur in the interface between the finished copper foil and board. Consequently, with time lapse, the so called pattern separation, etc. are caused, whereby making it infeasible to produce the high quality circuit boards.

On the other hand, the manufacturing method with processing stages shown in (A) of FIG. 1 uses the two-side copper-clad laminate as the starting material for the board, therefore, it is advantageous in that the defect as mentioned above can be avoided. In other words, because this two-side copper-clad laminate generally has the characteristic of effecting the firm adhesion between the board and the copper foil, it is free of the problem such as the pattern separation. Also, it has the other merit that the low price, low cost circuit boards can be manufactured. Nevertheless, as is clearly understood from the Figure, since this manufacturing method uses the wiring pattern designed to have the double layer structure, there are the following disadvantages accompanying it. That is, first, a long time is required for etching, thereby making it unworkable to obtain the fine line, high precision patterning. Second, the waste in amount of copper used becomes large, resulting in the hindrance imposed on the cost reduction.

As the result, the latter manufacuturing method is defective in that it cannot satisfactorily meet the need for forming the high density, high precision wiring pattern that is in specific demand today, and also that it is insufficient in capability to achieve the low cost and the resource saving.

SUMMARY OF THE INVENTION

Therefore, an object of the present invention is to provide a method for manufacturing a circuit board that is completely cleared of the defects of the prior art described above, while at the same time, maintaining the merits (high adhesiveness and low cost efficiency) of the two-side copper-clad laminate.

In keeping with the principles of the present invention, the object is accomplished by a unique method for manufacturing a circuit board with through hole, using the processes including: a selective etching of two-side copper-clad laminate in order to form the desired wiring pattern; boring a hole to be used as the through hole, at a specified location; masking of the board surface except the through hole surface, with conductive ink and with acidproof or alkaliproof ink; formation of conductive film over the through hole surface, by electroless plating; formation of metal foil with appropriate thickness over the conductive film, through electroplating, by using the conductive ink layer as electrode at one end; and the removal of the conductive ink and the acidproof or alkaliproof ink.

BRIEF DESCRIPTION OF THE DRAWINGS

The above-mentioned features and objects of the present invention will become more apparent by reference to the following description taken in conjunction with the accompanying drawings wherein like reference numerals and symbols indicate like elements, and in which.

DETAILED DESCRIPTION OF THE INVENTION

Detailed description will hereunder be given of the embodiment of the present invention with reference to the drawings.

Figure 1:
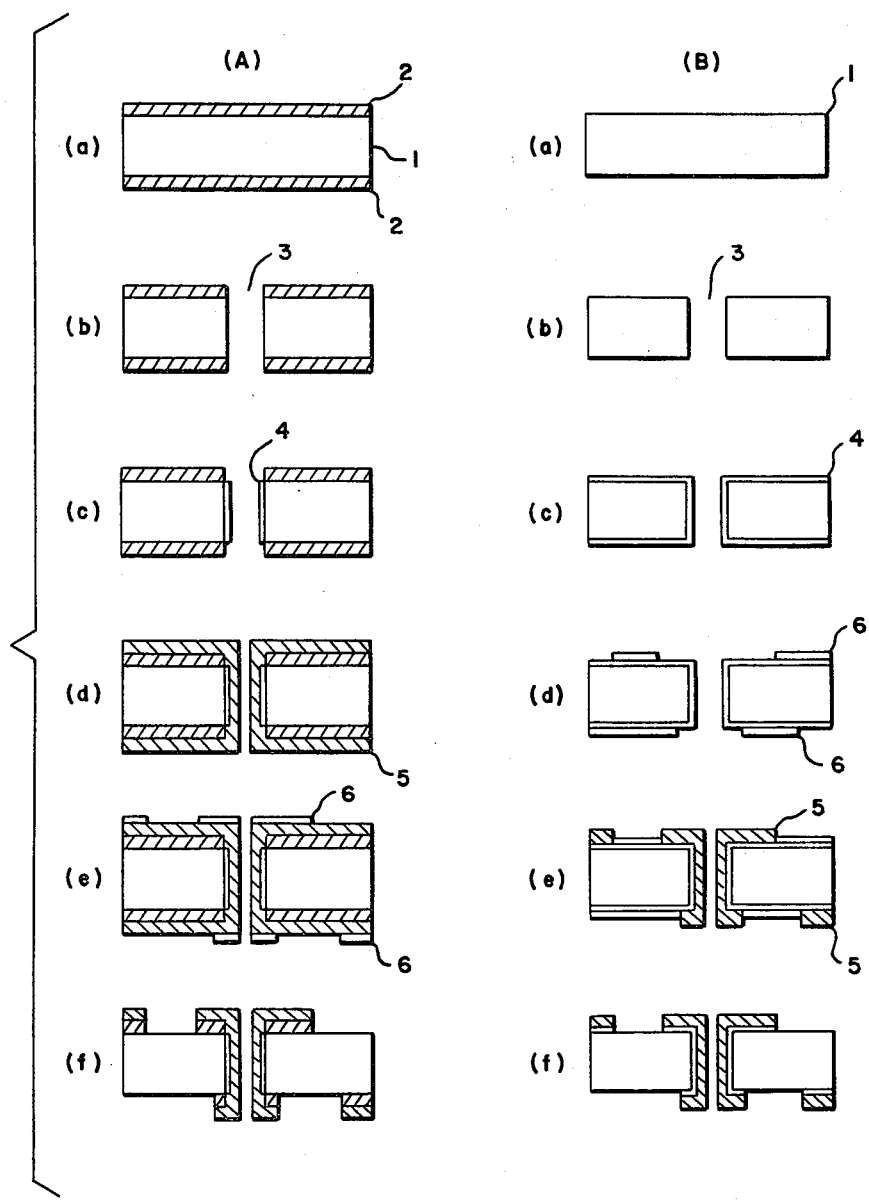
FIG. 1 (A) and (B) respectively show the conventional methods for manufacturing circuit boards with through holes, in the order of the processing steps.
Figure 2:
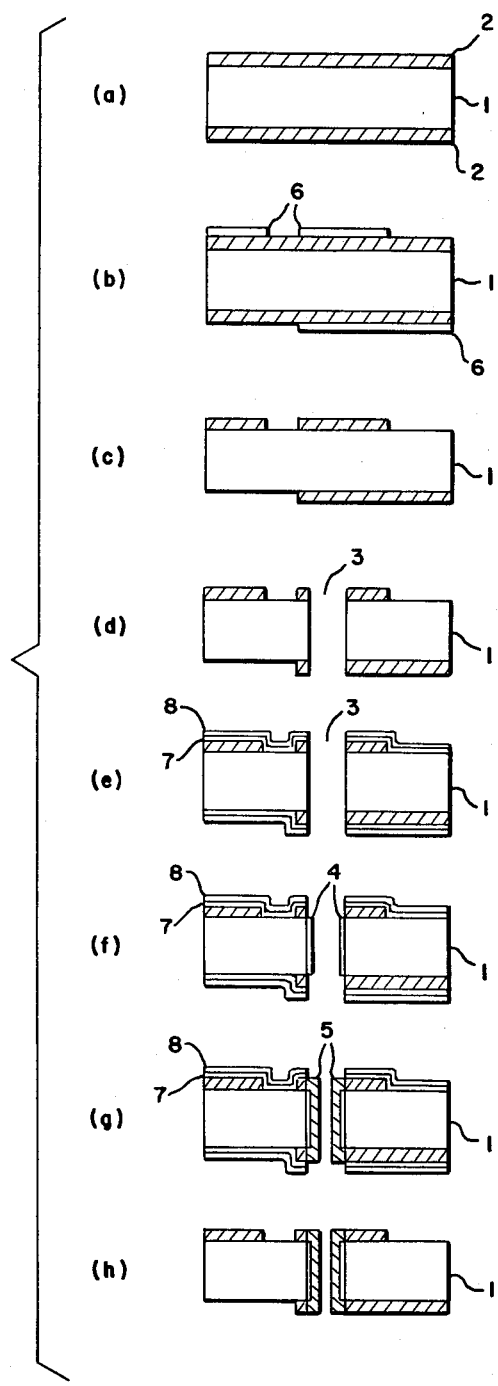
FIG. 2 shows a method for manufacturing the circuit board with through hole, according to the present invention, in the order of the processing sequence.

FIG. 2 shows the method for manufacturing a circuit board according to the present invention, in the order of its processing sequence. The same marks are used for the portions equal to or correspond to, with respect to the structure, those in FIG. 1.

The process shown in (b) of FIG. 2 is that for masking the wiring section with the resist film 6 obtained by the technique of screen printing of the epoxy system ink, and by the etching the wiring pattern shown in (c) of FIG. 2 is obtained. Thereafter, the pierced hole 3 to be used as the through hole is provided ((d) of FIG. 2. Next, the whole wiring section except the through hole portion is masked through printing the conductive ink 7, as a conductive film, over the board surface excluding the through hole surface, then, by further printing the pH-resistant ink 8; i.e., the acid-resistant or the alkali-resistant ink 8, as an acid-resistant or alkali-resistant film, over the surface printed with the conductive ink 7, by using the screen printing technique ((e) of FIG. 2). In this case, as the ink, the waterproof ink is used so that it does not flow out during the washing that is carried out if necessary. As the conductive ink used in such case, for example, those obtained by mixing denatured phenol, epoxy, carbon powder, rosin system resin, thinner system or alcohol system solvent, pigment, etc. may be used. Also, needless to say, the pH-resistant ink 8 that is laminated over the conductive ink 7 is selected depending on the pH of the plating solution.

Further, an originally film-form conductive material, that is, a conductive sheet may be used instead of forming above-mentioned conductive film with the conductive ink 7. Similarly, as the acid-resistant film or alkali-resistant film, a sheet having the property of acid-resistance may be used instead of using acid-resistant ink or alkali-resistant ink. Above described sheets may be obtained by adding light-sensitive materials, conductivity-providing materials such as carbon, chemical resistant materials to a base resin material such as polyethylene or polyamid, etc. To use above described sheets through so-called photo-etching process is effective to increase the accuracy of a circuit board.

After masking with ink, the process is proceeded to the electroless plating of the through hole 3. The plating solution used in this process is obtained, for example, by using copper sulfate as metallic salt, while using formalin as reducing agent. After the completion of this process, about several micron thick copper plate film 4 is obtained as the substrate metal. In addition, in this process, it goes with saying that the surface activation is performed as the pretreatment, by using the palladium solution, etc. Following this process, the electroplating process is started, by using the conductive ink 7 printed in the process (e), as the electrode at one end. As should be clearly understood, in this stage of the processing, because the conductive ink 7 is covering the surface of the board except the surface of the through hole 3, the copper plate film 4 at every through hole is in the state of continuity with such conductive ink 7. Consequently, through applying the electroplating for the appropriate duration, the plated copper 5 with the specified thickness (generally, about 35μ) is formed only on the portions other than the board surface masked with the acidproof or the alkaliproof ink 8, that is, only over the copper plate film 4 formed by the electroless plating ((g) of FIG. 2). After completing the through hole that is processed to be in continuity by the treatments mentioned above, through removing the conductive ink 7 and the acidproof or alkaliproof ink 8 laminated in the process (e) ((h) of FIG. 2), the circuit board with finished through holes having the specified distribution pattern can be obtained.

In the manufacturing method described above, what is completely different from the conventional method is that, in the processing stage of the electroplating of the through hole, the medium composing the electrode is formed of the conductive film such as conductive ink, etc. that can be removed later quite easily. The reason that one of the conventional methods shown previously had no choice but to recourse to the double layer structure for the wiring section is nothing but that the electrode was formed of the copper foil.

Different from the foregoing method, because the manufacturing method according to the present invention uses the conductive film as the electrode in the processing stage of the electroplating as mentioned above, the wiring section is not formed into the double layered structure. Accordingly, the etching time can be cut short, and the high precision can be achieved for its distribution pattern, besides, the quantity of the copper used can be minimized.

As has been described above, according to the present invention, the amount of the copper used that affects greatly on the manufacturing cost can be minimized, and also the etching time can be reduced. Therefore, the high precision and high density patterning can be implemented. In addition, through the reduction in etching time, the power consumption can be substantially cut down, thereby contributing also in terms of the energy economization.

In the description given above, the copper is applied as the metal used, but the other metals, such as nickel, may be also used. Furthermore, when to use the through hole for connecting the lead wire, it is naturally acceptable to modify the printing of the inks 7 and 8, so that the upper and lower portions of the plated copper mask the edge portion of the copper foil 2.

I claim:

1. A method for manufacturing a circuit board with through hole comprising the steps of:
    forming a wiring pattern by selective etching on a two-side copper-clad laminated board;
    providing a pierced hole to be used as through hole at a specified location;
    masking the surface of said board except said pierced hole portion with conductive film and pH-resistant film;

forming a conductive plate film over the surface of said pierced hole portion by electroless plating;

forming a metal foil over said conductive plate film, through electroplating, by using said conductive film layer as an electrode at one end; and removing said conductive film as well as pH-resistant film.

2. A method according to claim 1, wherein said pH-resistant film is acid-proof ink.

3. A method according to claim 1, wherein said pH-resistant film is alkali-proof ink.

4. A method according to claim 1, wherein said conductive film is conductive, light-sensitive resin film.

5. A method according to claim 1, wherein said pH-resistant film is conductive, light-sensitive resin film.

* * * * *